United States Patent
Kim et al.

(10) Patent No.: US 10,629,281 B2
(45) Date of Patent: Apr. 21, 2020

(54) NONVOLATILE MEMORY APPARATUS AND AN OPERATING METHOD THEREOF BASED ON A POWER-UP SIGNAL

(71) Applicant: SK hynix Inc., Icheon-si Gyeonggi-do (KR)

(72) Inventors: Kwi Dong Kim, Incheon (KR); Keun Sik Ko, Seongnam-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/184,773

(22) Filed: Nov. 8, 2018

(65) Prior Publication Data

US 2019/0325975 A1 Oct. 24, 2019

(30) Foreign Application Priority Data

Apr. 23, 2018 (KR) .................. 10-2018-0046537

(51) Int. Cl.
| | | |
|---|---|---|
| *G11C 17/18* | (2006.01) | |
| *G11C 17/16* | (2006.01) | |
| *H01L 27/112* | (2006.01) | |

(52) U.S. Cl.
CPC .............. *G11C 17/18* (2013.01); *G11C 17/16* (2013.01); *H01L 27/11206* (2013.01)

(58) Field of Classification Search
None
See application file for complete search history.

(56) References Cited

U.S. PATENT DOCUMENTS

| 5,943,284 A | * | 8/1999 | Mizuno | G06F 12/0893 |
| | | | | 365/230.03 |
| 6,421,272 B1 | * | 7/2002 | Noguchi | G11C 16/0483 |
| | | | | 365/185.05 |
| 2006/0104117 A1 | * | 5/2006 | Kameda | G11C 16/0483 |
| | | | | 365/185.18 |
| 2006/0126386 A1 | * | 6/2006 | Kameda | G11C 16/3454 |
| | | | | 365/185.17 |
| 2006/0227609 A1 | * | 10/2006 | Pascucci | G11C 16/0483 |
| | | | | 365/185.17 |
| 2007/0076494 A1 | * | 4/2007 | Takeuchi | G11C 7/12 |
| | | | | 365/200 |

FOREIGN PATENT DOCUMENTS

KR 1020150067570 A 6/2015

\* cited by examiner

*Primary Examiner* — J. H. Hur
(74) *Attorney, Agent, or Firm* — William Park & Associates Ltd.

(57) ABSTRACT

A nonvolatile memory apparatus and an operating method of the nonvolatile memory apparatus may include a first memory cell array, a second memory cell array, a bit line switch, and a sensing control signal generation circuit. The first and second memory cell arrays may be coupled to a bit line. The bit line switch may electrically couple the first memory cell array to the second memory cell array according to an operation period of the non-volatile memory apparatus.

18 Claims, 6 Drawing Sheets

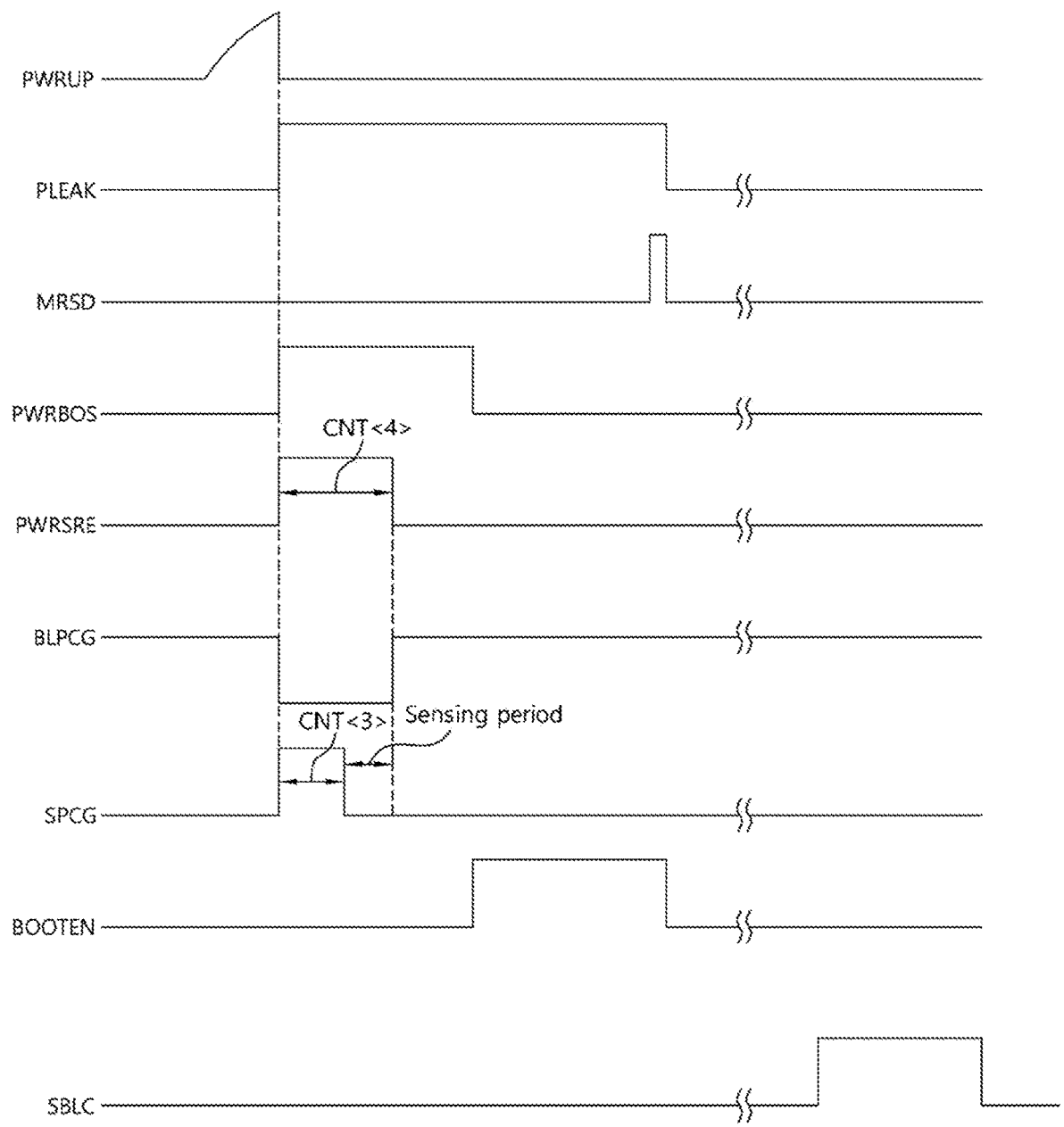

US 10,629,281 B2

NONVOLATILE MEMORY APPARATUS AND AN OPERATING METHOD THEREOF BASED ON A POWER-UP SIGNAL

CROSS-REFERENCES TO RELATED APPLICATION

The present application claims priority under 35 U.S.C. § 119(a) to Korean application number 10-2018-0046537, filed on Apr. 23, 2018, in the Korean Intellectual Property Office, which is incorporated herein by reference in its entirety.

BACKGROUND

1. Technical Field

Various embodiments of the present disclosure relate to an integrated circuit technology and, more particularly, to a semiconductor apparatus and a nonvolatile memory device.

2. Related Art

An electronic device includes many electronic elements, and a computer system includes many semiconductor apparatuses, each including many semiconductors. The semiconductor apparatuses may include nonvolatile memory apparatuses and may store information related to operations of the semiconductor apparatuses. The nonvolatile memory apparatuses may include a Read Only Memory (ROM), a Programmable Read Only Memory (PROM), an Erasable Programmable Read Only Memory (EPROM), an Electrically Erase and Programmable Read Only Memory (EEPROM), a One Time Programmable (OTP) memory, etc.

Among the above-described nonvolatile memory apparatuses, the OTP memory includes a fuse array as a memory cell array. The fuse array includes a plurality of fuses and stores various data according to program statuses of the fuses. The fuses may include a physical fuse and an electrical fuse, Between them, the electrical fuse is widely used in the field of the semiconductor apparatus technology. An anti-fuse is an example of the electrical fuse. The anti-fuse may be programmed through an electrical signal, The anti-fuse using the metal-oxide-semiconductor (MOS) transistor may be programmed through the breakdown of the gate oxide of the MOS transistor. Data stored in the anti-fuse is read through sensing of the breakdown status of the anti-fuse.

SUMMARY

In accordance with an embodiment of the present disclosure, a nonvolatile memory apparatus may include a first memory cell array, a second memory cell array, a bit line switch, and a sensing control signal generation circuit. The first memory cell array includes a plurality of first memory cells coupled between a plurality of first word lines and a bit line. The second memory cell array includes a plurality of second memory cells coupled between a plurality of second word lines and the bit line. The bit line switch is coupled to the bit line and is configured to electrically couple the first memory cell array to the second memory cell array. The bit line switch may electrically couple the first memory cell array to the second memory cell array according to an operation period of the non-volatile memory apparatus.

In accordance with an embodiment of the present disclosure, a nonvolatile memory apparatus may include a first memory cell array, a second memory cell array, a bit line switch, and a data sensing circuit. The first memory cell array includes a plurality of first memory cells coupled between a plurality of first word lines and a bit line. The second memory cell array includes a plurality of second memory cells coupled between a plurality of second word lines and the bit line. The bit line switch is coupled to the bit line and is configured to electrically couple the first memory cell array to the second memory cell array based on a bit line control signal. The data sensing circuit is configured to precharge a sensing node coupled to the bit line based on a power-up signal during a period other than a first period, is configured to precharge an output node during a second period within the first period, and is configured to generate an output signal by changing a voltage level of the output node according to a voltage level of the sensing node after the second period.

In accordance with an embodiment of the present disclosure, an operating method of a nonvolatile memory apparatus including a first memory cell array and a second memory cell array electrically coupled to each other through a bit line may include electrically isolating the first memory cell array from the second memory cell array based on a power-up signal. The operating method also includes changing a voltage level of a sensing node through the bit line coupled to the first memory cell array and preventing the sensing node from being precharged during a first period. The operating method additionally includes precharging an output node during a second period within the first period and generating an output signal by changing a voltage level of the output node based on the voltage level of the sensing node after the second period.

In accordance with an embodiment of the present disclosure, an operating method of a nonvolatile memory apparatus including a first memory cell array and a second memory cell array electrically coupled to each other through a bit line may include electrically isolating the first memory cell array from the second memory cell array according to an operation period of the non-volatile memory apparatus.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

Figure 1:
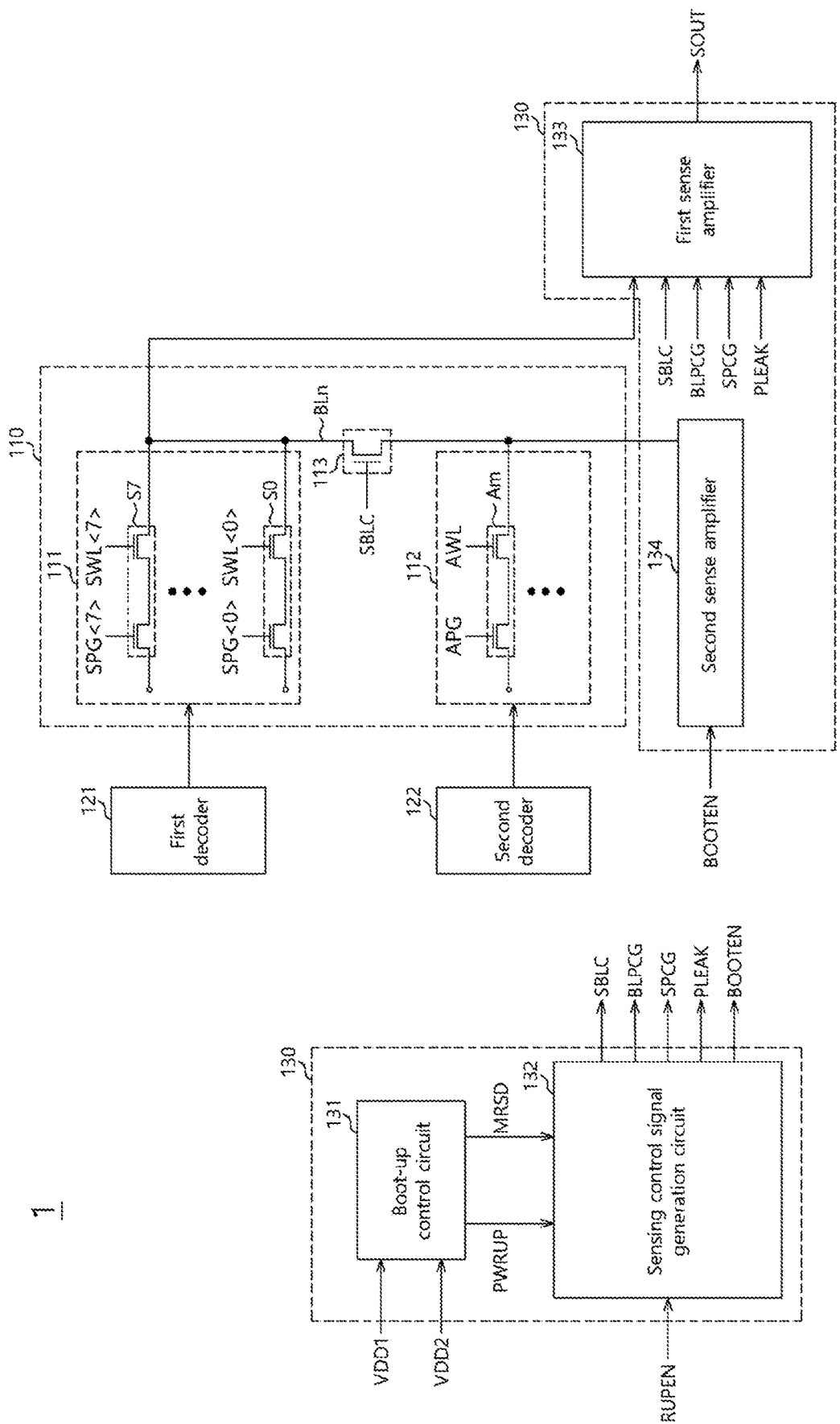
FIG. 1 shows a diagram illustrating a configuration of a nonvolatile memory apparatus, in accordance with an embodiment of the present disclosure.

FIG, 2 shows a diagram illustrating a configuration of a first sense amplifier illustrated in FIG. 1.

Figure 3:
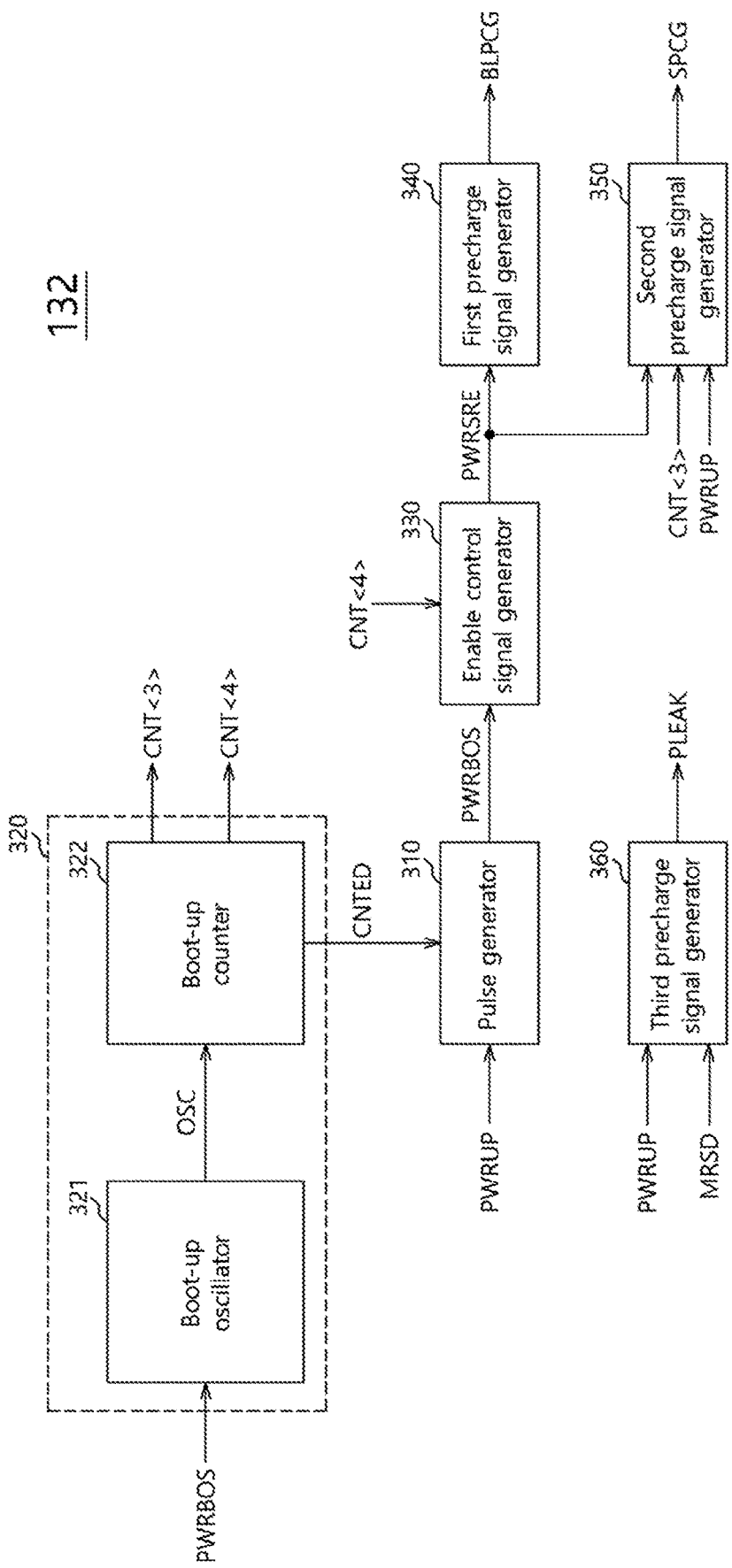

FIG. 3 shows a diagram illustrating a configuration of a sensing control signal generation circuit illustrated in FIG. 1.

Figure 4:
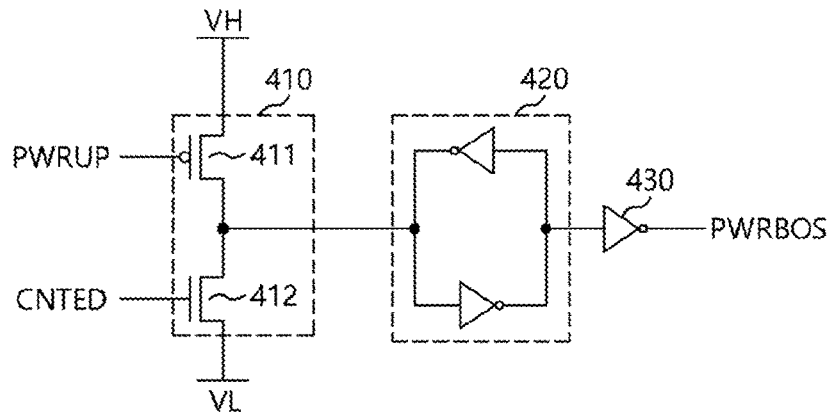

FIG. 4 shows a diagram illustrating a configuration of a pulse generator illustrated in FIG. 3.

Figure 5:
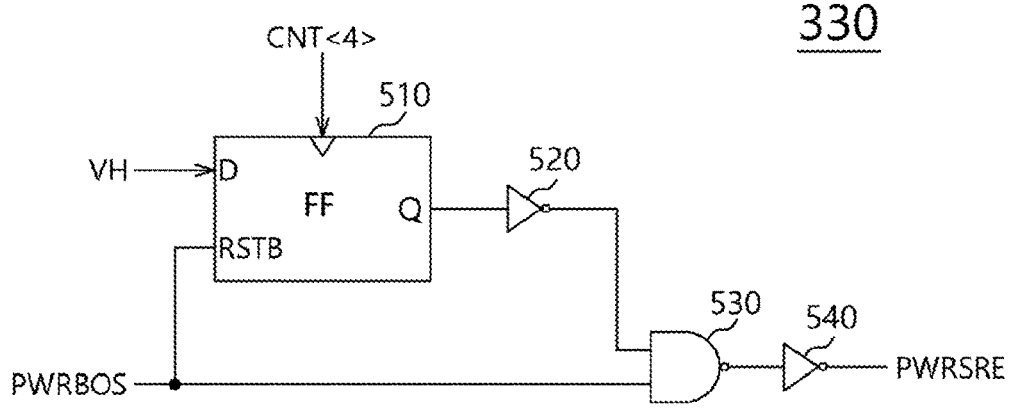

FIG. 5 shows a diagram illustrating a configuration of an enable control signal generator illustrated in FIGS. 3.

Figure 6:
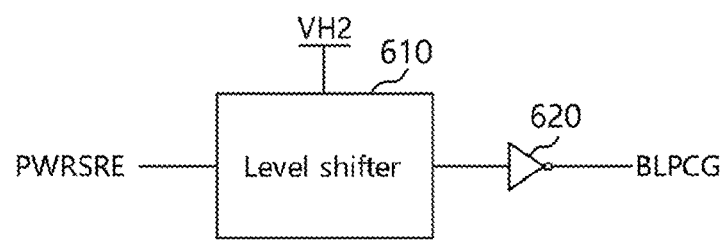

FIG. 6 shows a diagram illustrating a configuration of a first precharge signal generator illustrated in FIG. 3.

Figure 7:
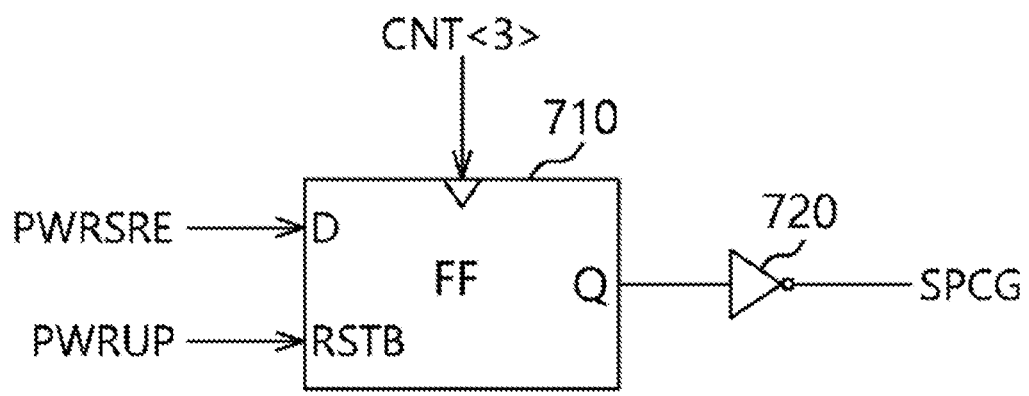

FIG. 7 shows a diagram illustrating a configuration of a second precharge signal generator illustrated in FIG. 3.

Figure 8:
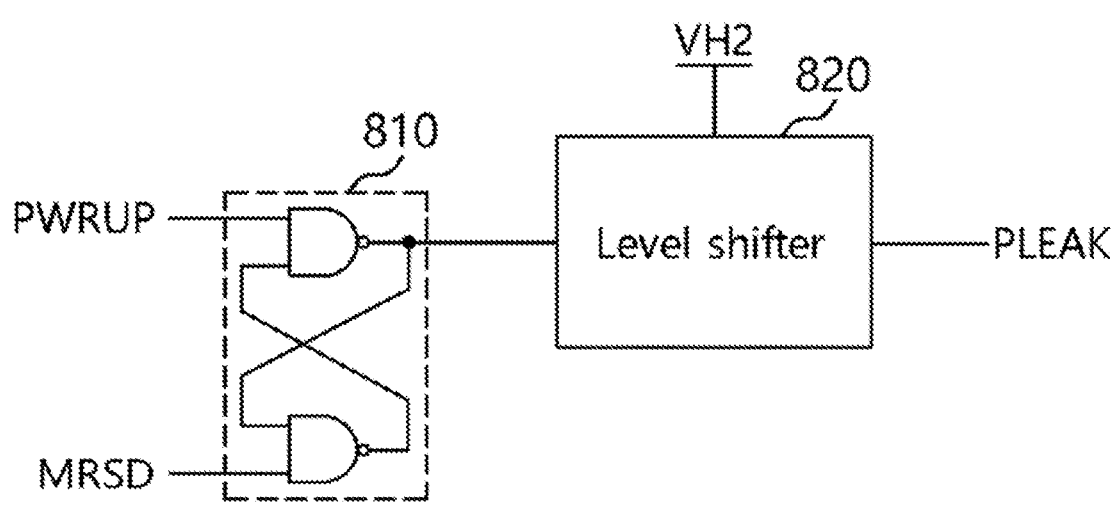

FIG. 8 shows a diagram illustrating a configuration of a third precharge signal generator illustrated in FIG. 3.

FIG. 9 shows a timing diagram illustrating an operation of a nonvolatile memory apparatus, in accordance with an embodiment of the present disclosure.

DETAILED DESCRIPTION

A semiconductor apparatus according to the present disclosure is described below with reference to embodiments illustrated by the accompanying drawings.

FIG. 1 shows a diagram illustrating a configuration of a nonvolatile memory apparatus 1, in accordance with an embodiment of the present disclosure. Referring to FIG. 1, the nonvolatile memory apparatus 1 may include a memory cell array 110. The memory cell array 110 may include a plurality of word lines, a plurality of bit lines, and a plurality of memory cells coupled to cross points between the plurality of word lines and the plurality of bit lines. The plurality of memory cells may include nonvolatile memory cells. For example, the memory cells may be fuse cells and the fuse cells may include electrical fuses and/or anti-fuses. Embodiments are not limited to a particular type of memory cell and the plurality of memory cells may represent any kind of known nonvolatile memory cells. The memory cell array 110 may include a first memory cell array 111 and a second memory cell array 112. The first memory cell array 111 may include a plurality of word lines SWL<0:7> (SWL<0> . . . SWL<7> as shown; also referred to as first word lines) and a bit line BLn (n is an integer equal to or greater than zero (0)). The second memory cell array 112 may include a plurality of word lines AWL (also referred to as second word lines) and the bit line BLn. The first memory cell array 111 and the second memory cell array 112 may share the bit line BLn. That is, the plurality of word lines SWL<0:7> of the first memory cell array 111 and the plurality of word lines AWL of the second memory cell array 112 may be commonly coupled to the bit line BLn. The first memory cell array 111 may store first information and the second memory cell array 112 may store second information. The first information and the second information may be the same or different kinds of data. For example, the first information may be operation setting information of a semiconductor apparatus including the nonvolatile memory apparatus 1. The second information may be defect information and/or repair information of the semiconductor apparatus. In one instance, the first information may include information to set levels of voltages used for programming data into the second memory cell array 112 or for reading data stored in the second memory cell array 112 according to the second information.

The first memory cell array 111 may include first to eighth memory cells S0 to 57 (S0 . . . S7 as shown). Embodiments are not limited to any particular number of memory cells included in the first memory cell array 111 (also referred to as first memory cells). The first to eighth memory cells S0 to S7 may form a group. For example, impedance values and/or resistance values of the first to eighth memory cells S0 to S7 may be combined to form a single piece of data. Although not illustrated, the first memory cell array 111 may further include memory cells forming a plurality of groups. The memory cells of the first memory cell array 111 may receive assigned program signals among first to eighth program signals SPG<0:7> (SPG<0> . . . SPG<7> as shown), and may receive a word line selection signal or may be coupled to the plurality of word lines SWL<0:7>. The first to eighth program signals SPG<0:7> may be applied to program or read the first to eighth memory cells S0 to S7. The first to eighth program signals SPG<0:7> may have a first predetermined voltage level in order to program the first to eighth memory cells S0 to S7. The first to eighth program signals SPG<0:7> may have a second predetermined voltage level in order to allow currents to flow through the first to eighth memory cells S0 to S7 for reading statuses of the first to eighth memory cells S0 to S7. The first predetermined voltage level may be equal to or higher than the second predetermined voltage level. When the plurality of word lines SWL<0:7> are enabled, the first to eighth memory cells S0 to S7 may be respectively coupled to the bit line BLn. The first memory cell S0, for example, may receive the first program signal SPG<0> and may be coupled to the first word line SWL<0>. The eighth memory cell S7 may receive the eighth program signal SPG<7> and may be coupled to the eighth word line SWL<7>.

The second memory cell array 112 may include memory cells Am (m is an integer greater than zero (0)). The memory cells Am (also referred to as second memory cells) may receive another program signal APG and may be coupled to the plurality of word lines AWL. The first to eighth program signals SPG<0:7> and the program signal APG may be generated based on address signals different from each other. The plurality of word lines SWL<0:7> and the plurality of word lines AWL may be enabled on the basis of address signals different from each other. The nonvolatile memory apparatus 1 may further include a first decoder 121 and a second decoder 122. The first decoder 121 may generate the first to eighth program signals SPG<0:7> and may enable the plurality of word lines SWL<0:7>. The second decoder 122 may generate another program signal APG and may enable the plurality of word lines AWL. The first to eighth memory cells S0 to S7 and the memory cells Am may be programmed on the basis of the first to eighth program signals SPG<0:7> and the program signal APG. For example, the first to eighth memory cells S0 to S7 and the memory cells Am may be set to have different resistance values to store data. For example, when the first to eighth memory cells S0 to S7 and the memory cells Am are electrical fuses and/or anti-fuses, the first to eighth memory cells S0 to S7 and the memory cells Am may be in a low-resistance status when they are ruptured and may be in a high-resistance status when they are not ruptured. Therefore, when reading data stored in the first to eighth memory cells S0 to S7 and the memory cells Am, currents flowing through the bit line BLn and/or voltages of the bit line BLn may change according to the resistance statues of the first to eighth memory cells S0 to S7 and the memory cells Am.

The nonvolatile memory apparatus 1 may further include a bit line switch 113. The bit line switch 113 may receive a bit line control signal SBLC, The bit line switch 113 may electrically couple the first memory cell array 111 and the second memory cell array 112 based on the bit line control signal SBLC. The bit line switch 113 may be coupled and/or disposed in or within the middle of the bit line BLn. The bit line switch 113 may be coupled and/or disposed in a location discriminating the first memory cell array 111 and the second memory cell array 112 from each other. When the bit line control signal SBLC is enabled, the bit line switch 113 may electrically couple the first memory cell array 111 to the second memory cell array 112. When the bit line control signal SBLC is disabled, the bit line switch 113 may electrically isolate the first memory cell array 111 from the second memory cell array 112. The bit line control signal SBLC may be selectively enabled according to operation periods of the nonvolatile memory apparatus 1. For example, the bit line control signal SBLC may be enabled during a rupture period in which memory cells of the first memory cell array 111 are programmed and may be disabled during a period other than the rupture period. When the first memory cell array 111 is electrically isolated from the second memory cell array 112 and data stored in the first memory cell array 111 is read through the bit line BLn, the bit line switch 113 may block loading by the second memory cell array 112 and may allow data stored in the first memory cell array 111 to be precisely read.

The nonvolatile memory apparatus 1 may further include a data sensing circuit 130. The data sensing circuit 130 may generate an output signal SOUT by reading data stored in the first to eighth memory cells S0 to S7 of the first memory cell array 111 through the bit line BLn. The data sensing circuit 130 may read data stored in the memory cell array 110 by performing various precharge operations according to operation periods. The data sensing circuit 130 may perform precharge operations based on a power-up signal PWRUP and may sense and amplify data stored in the first to eighth memory cells S0 to S7 of the first memory cell array 111. The data sensing circuit 130 may generate a plurality of precharge signals based on the power-up signal PWRUP and may read data stored in the first memory cell array 111 based on the plurality of precharge signals. Referring to FIG. 1, the data sensing circuit 130 may include a boot-up control circuit 131, a sensing control signal generation circuit 132, and a first sense amplifier 133.

The boot-up control circuit 131 may generate the power-up signal PWRUP by receiving a first power voltage VDD1. The first power voltage VDD1 may be a power voltage of a semiconductor apparatus including the nonvolatile memory apparatus 1 and may be provided by an external power source. When the first power voltage VDD1 is provided, the boot-up control circuit 131 may enable the power-up signal PWRUP by detecting whether the first power voltage VDD1 reaches a target level. For example, the power-up signal PWRUP may rise according to a level of the first power voltage VDD1 and may be enabled to a low level when the first power voltage VDD1 reaches a target level. The power-up signal PWRUP may indicate a start of a boot-up operation period of the nonvolatile memory apparatus 1. In an embodiment, the boot-up control circuit 131 may receive a second power voltage VDD2 together with the first power voltage VDD1. The second power voltage VDD2 may be provided by an external power source or may be generated within the semiconductor apparatus. The second power voltage VDD2 may have a higher voltage level than the first power voltage VDD1. The boot-up control circuit 131 may detect whether the second power voltage VDD2 reaches another target level. In an embodiment, the boot-up control circuit 131 may enable the power-up signal PWRUP when both the first power voltage VDD1 and the second power voltage VDD2 reach their target levels. The boot-up control circuit 131 may generate a boot-up end signal MRSD at a predetermined time after the power-up signal PWRUP is enabled. The boot-up end signal MRSD may indicate an end of the boot-up operation period of the nonvolatile memory apparatus 1. The predetermined time may be arbitrarily set.

The sensing control signal generation circuit 132 may receive the power-up signal PWRUP and the boot-up end signal MRSD. The sensing control signal generation circuit 132 may generate various sensing control signals based on the power-up signal PWRUP for the nonvolatile memory apparatus 1 to perform a read operation. The sensing control signal generation circuit 132 may disable any enabled sensing control signal based on the boot-up end signal MRSD. The sensing control signal generation circuit 132 may generate a first precharge signal BLPCG and a second precharge signal SPCG based on the power-up signal PWRUP. The sensing control signal generation circuit 132 may generate the bit line control signal SBLC based on a rupture enable signal RUPEN. The sensing control signal generation circuit 132 may further generate a third precharge signal PLEAK based on the power-up signal PWRUP. The sensing control signal generation circuit 132 may further generate a boot-up signal BOOTEN. The sensing control signal generation circuit 132 may generate the boot-up signal BOOTEN for a read operation from the second memory cell array 112 when a read operation from the first memory cell array 111 is completed.

The first sense amplifier 133 may read data stored in the first to eighth memory cells S0 to S7 of the first memory cell array 111. The first sense amplifier 133 may read data stored in the first to eighth memory cells S0 to S7 while performing a precharge operation. When the first to eighth program signals SPG<0:7> are provided and the plurality of word lines SWL<0:7> are enabled for reading data stored in the first to eighth memory cells S0 to S7, gate leakage may occur in transistors forming the first to eighth memory cells S0 to S7. The gate leakage may cause a voltage level of the bit line BLn to rise or may cause a current to flow through the bit line BLn even when the first to eighth memory cells S0 to S7 are in high-resistance statues. Therefore, the first sense amplifier 133 may minimize the effect of the leakage introduced to the bit line BLn and perform a precise sensing operation by performing various precharge operations in a plurality of sections. The first sense amplifier 133 may be coupled to the first memory cell array 111 through the bit line BLn. The first sense amplifier 133 may receive the first precharge signal BLPCG and the second precharge signal SPCG. The first sense amplifier 133 may perform a first precharge operation based on the first precharge signal BLPCG and may perform a second precharge operation based on the second precharge signal SPCG. The first sense amplifier 133 may generate the output signal SOUT by sensing the voltage level of the bit line BLn based on the bit line control signal SBLC, the first precharge signal BLPCG, and the second precharge signal SPCG. The first sense amplifier 133 may become ready for sensing the voltage level of the bit line BLn during a first period after the power-up signal PWRUP is enabled. The first precharge signal BLPCG may be disabled during the first period and may be enabled during a period other than the first period. The first sense amplifier 133 might not perform the first precharge operation during the first period and may perform the first precharge operation during a period other than the first period. The second precharge signal SPCG may be enabled during a second period. The second period may be shorter than the first period and may be within the first period. The first sense amplifier 133 may perform a second precharge operation during the second period within the first period and may generate the output signal SOUT by sensing the voltage level of the bit line BLn after the second precharge operation is completed. The first sense amplifier 133 may further receive the third precharge signal PLEAK. The first sense amplifier 133 may further perform additional precharge operations based on the third precharge signal PLEAK. The third precharge signal PLEAK may be enabled during the boot-up operation period of the nonvolatile memory apparatus 1. The boot-up operation period may include the first period and the second period.

The data sensing circuit 130 may further include a second sense amplifier 134. The second sense amplifier 134 may read data stored in the memory cells Am of the second memory cell array 112. The second sense amplifier 134 may be coupled to the bit line BLn and may read data stored in the memory cells Am of the second memory cell array 112 through the bit line BLn. The second sense amplifier 134 may receive the boot-up signal BOOTEN. The second sense amplifier 134 may perform a read operation from the second memory cell array 112 based on the boot-up signal BOOTEN.

Figure 2:
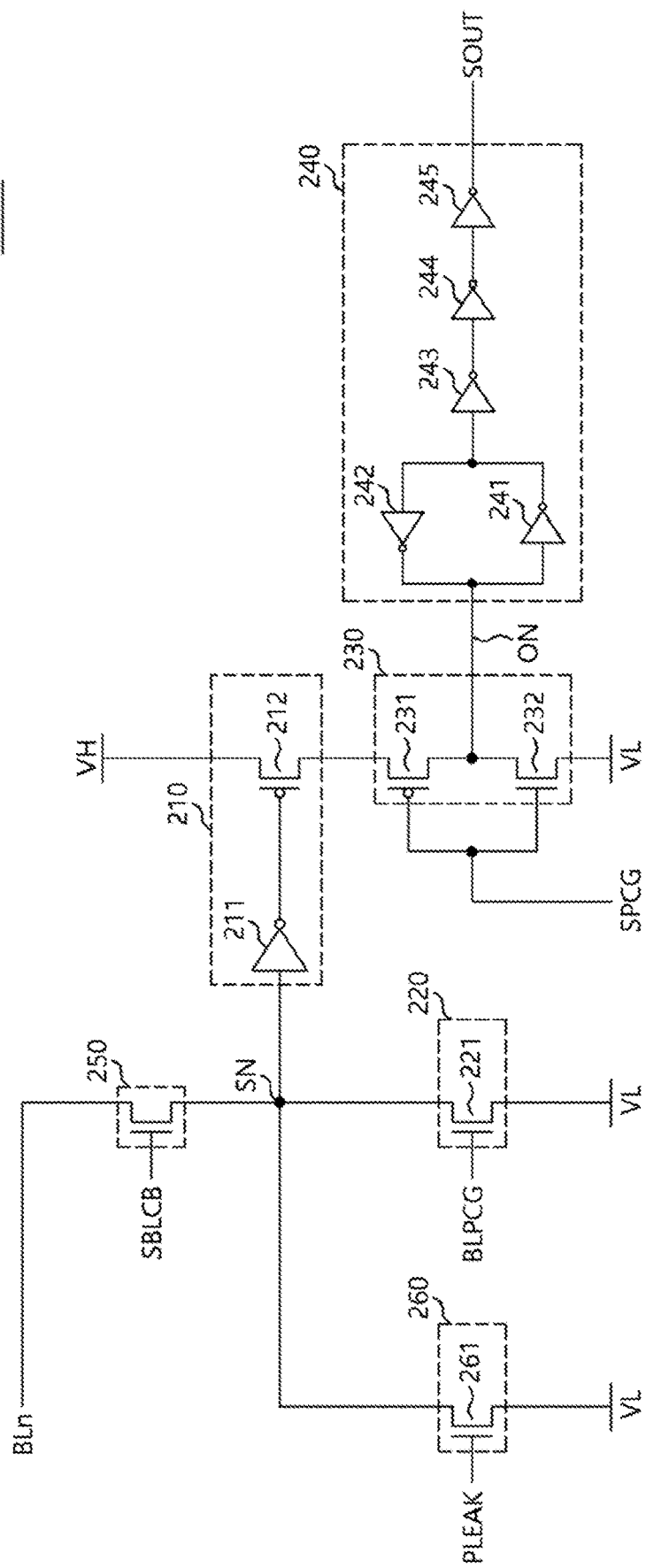

FIG. 2 shows a diagram illustrating a representation of the first sense amplifier 133 illustrated in FIG. 1. Referring to FIG. 2, the first sense amplifier 133 may include a sensing unit 210, a first precharge unit 220, a second precharge unit 230, and an output latch unit 240. The sensing unit 210 may be coupled to the bit line BLn. The sensing unit 210 may be coupled to the bit line BLn through a sensing node SN. The sensing unit 210 may provide a high voltage VH according to the voltage level of the sensing node SN. For example, the sensing unit 210 may provide the high voltage VH when the voltage level of the sensing node SN is at a high level, and might not provide the high voltage VH when the voltage level of the sensing node SN is at a low level.

The first precharge unit 220 may be coupled to the sensing node SN. The first precharge unit 220 may receive the first precharge signal BLPCG, The first precharge unit 220 may perform the first precharge operation based on the first precharge signal BLPCG. The first precharge unit 220 may precharge the sensing node SN based on the first precharge signal BLPCG. The first precharge unit 220 may initialize the voltage level of the sensing node SN by precharging the voltage level of the sensing node SN during a period other than the first period. The first precharge unit 220 might not precharge the sensing node SN during the first period. The first precharge unit 220 may allow the sensing unit 210 to precisely detect the voltage level of the sensing node SN by not precharging the sensing node SN during the first period. The first precharge unit 220 may drive the sensing node SN to a low voltage VL when the first precharge signal BLPCG is enabled, and might not drive the sensing node SN to the low voltage VL when the first precharge signal BLPCG is disabled.

The second precharge unit 230 may be coupled to the sensing unit 210 and an output node ON. The second precharge unit 230 may receive the second precharge signal SPCG. The second precharge unit 230 may perform the second precharge operation based on the second precharge signal SPCG. The second precharge unit 230 may couple the sensing unit 210 to the output node ON or may precharge the output node ON, based on the second precharge signal SPCG. The second precharge unit 230 may precharge the output node ON during the second period. The second precharge unit 230 may drive the output node ON to the low voltage VL when the second precharge signal SPCG is enabled, and may couple the sensing unit 210 to the output node ON when the second precharge signal SPCG is disabled. The output latch unit 240 may be coupled to the output node ON. The output latch unit 240 may latch the voltage level of the output node ON and may generate the output signal SOUT by buffering the latched signal.

The first sense amplifier 133 may further include a read switch 250 and a third precharge unit 260. The read switch 250 may selectively couple the first sense amplifier 133 to the bit line BLn based on the bit line control signal SBLC. For example, the read switch 250 may receive a complementary signal SBLCB of the bit line control signal SBLC. The read switch 250 may block the connection between the bit line BLn and the first sense amplifier 133 when the bit line control signal SBLC is enabled, and may couple the first sense amplifier 133 to the bit line BLn when the bit line control signal SBLC is disabled. The third precharge unit 260 may be coupled to the sensing node SN. The third precharge unit 260 may receive the third precharge signal PLEAK. The third precharge unit 260 may precharge the sensing node SN based on the third precharge signal PLEAK. The third precharge unit 260 may precharge the sensing node SN by driving the sensing node SN to the low voltage VL when the third precharge signal PLEAK is enabled. According to an embodiment of the present invention, driving forces of the first precharge unit 220 and the third precharge unit 260 may be sufficiently small such that the voltage level of the sensing node SN changes according to the voltage level of the bit line BLn.

The sensing unit 210 may include a first inverter 211 and a first transistor 212. An input node of the first inverter 211 may be coupled to the sensing node SN and may be coupled to the bit line BLn through the sensing node SN and the read switch 250. The first transistor 212 may be P-channel MOS transistor. The first transistor 212 may be coupled to an output node of the first inverter 211 at its gate, and may receive the high voltage VH at its source. The first precharge unit 220 may include a second transistor 221. The second transistor 221 may be an N-channel MOS transistor. The second transistor 221 may receive the first precharge signal BLPCG at its gate, may be coupled to the sensing node SN at its drain, and may be coupled to the low voltage VL at its source. The second precharge unit 230 may include a third transistor 231 and a fourth transistor 232. The third transistor 231 may be a P-channel MOS transistor and the fourth transistor 232 may be an N-channel MOS transistor. The third transistor 231 may receive the second precharge signal SPCG at its gate, may be coupled to a drain of the first transistor 212 at its source, and may be coupled to the output node ON at its drain. The fourth transistor 232 may receive the second precharge signal SPCG at its gate, may be coupled to the output node ON at its drain, and may be coupled to the low voltage VL at its source. The output latch unit 240 may include a second inverter 241, a third inverter 242, a fourth inverter 243, a fifth inverter 244, and a sixth inverter 245. The second inverter 241 and the third inverter 242 may form a latch invert and latch the voltage level of the output node ON. The fourth to sixth inverters 243, 244, and 245 may form a buffer to generate the output signal SOUT by inversion-driving the signal, which is inversion-latched by the second and third inverters 241 and 242. FIG. 2 shows three inverters configured to perform the buffering operation, however, possible embodiments are not limited to three inverters performing the buffering operation. Any odd numbers of inverters may be configured to perform the buffering operation.

FIG. 3 shows a diagram illustrating a configuration of the sensing control signal generation circuit 132 illustrated in FIG. 1. Referring to FIG. 3, the sensing control signal generation circuit 132 may include a pulse generator 310, a timing control signal generator 320, an enable control signal generator 330, a first precharge signal generator 340, and a second precharge signal generator 350. The pulse generator 310 may receive the power-up signal PWRUP. The pulse generator 310 may generate a first control signal PWRBOS based on the power-up signal PWRUP. The pulse generator 310 may further receive a counting end signal CNTED. The pulse generator 310 may enable the first control signal PWRBOS when the power-up signal PWRUP is enabled, and may disable the first control signal PWRBOS when the counting end signal CNTED is enabled.

The timing control signal generator 320 may receive the first control signal PWRBOS and may generate a first timing control signal CNT<4> and a second timing control signal CNT<3>. The timing control signal generator 320 may perform a counting operation when the first control signal PWRBOS is enabled and may generate the first timing control signal CNT<4> and the second timing control signal CNT<3> according to the result of the counting operation. The timing control signal generator 320 may include a boot-up oscillator 321 and a boot-up counter 322. The boot-up oscillator 321 may receive the first control signal PWRBOS and may generate an oscillating signal OSC. The boot-up oscillator 321 may generate the oscillating signal OSC, which toggles periodically, such as a clock signal, while the first control signal PWRBOS is enabled, The boot-up counter 322 may receive the oscillating signal OSC and may generate the first timing control signal CNT<4>, the second timing control signal CNT<3>, and the counting end signal CNTED, The boot-up counter 322 may generate the first timing control signal CNT<4> and the second timing control signal CNT<3> by counting the oscillating signal OSC. For example, the boot-up counter 322 may generate the first timing control signal CNT<4> and the second timing control signal CNT<3> by counting a number of toggles of the oscillating signal OSC. For example, the boot-up counter 322 may generate the second timing control signal CNT<3> when the oscillating signal OSC toggles three times and may generate the first timing control signal CNT<4> when the oscillating signal OSC toggles four times. The boot-up counter 322 may enable the counting end signal CNTED when the oscillating signal OSC toggles a predetermined number of times (e.g., five times or more).

The enable control signal generator 330 may receive the first control signal PWRBOS and the first timing control signal CNT<4> and output a second control signal PWRSRE. The enable control signal generator 330 may generate the second control signal PWRSRE based on the first control signal PWRBOS and the first timing control signal CNT<4>. The enable control signal generator 330 may enable the second control signal PWRSRE when the first control signal PWRBOS is enabled and may disable the second control signal PWRSRE when the first timing control signal CNT<4> is enabled. Therefore, the enable control signal generator 330 may generate the second control signal PWRSRE, which is enabled during the first period.

The first precharge signal generator 340 may receive the second control signal PWRSRE and may output the first precharge signal BLPCG. The first precharge signal generator 340 may generate the first precharge signal BLPCG based on the second control signal PWRSRE. The first precharge signal generator 340 may generate the first precharge signal BLPCG, which is disabled while the second control signal PWRSRE is enabled. For example, the first precharge signal generator 340 may generate the first precharge signal BLPCG by shifting the voltage level of the second control signal PWRSRE, The second precharge signal generator 350 may receive the second control signal PWRSRE and the second timing control signal CNT<3> and may output the second precharge signal SPCG. The second precharge signal generator 350 may generate the second precharge signal SPCG based on the second control signal PWRSRE and the second timing control signal CNT<3>. The second precharge signal generator 350 may further receive the power-up signal PWRUP. The second precharge signal generator 350 may increase the voltage level of the second precharge signal SPCG based on the power-up signal PWRUP and may keep the second precharge signal SPCG enabled when the second control signal PWRSRE is enabled, The second precharge signal generator 350 may disable the second precharge signal SPCG based on the second timing control signal CNT<3>, The second precharge signal generator 350 may generate the second precharge signal SPCG, which is enabled during the second period.

The sensing control signal generation circuit 132 may further include a third precharge signal generator 360. The third precharge signal generator 360 may receive the power-up signal PWRUP and the boot-up end signal MRSD and may output the third precharge signal PLEAK. The third precharge signal generator 360 may enable the third precharge signal PLEAK by increasing the voltage level of the third precharge signal PLEAK based on the power-up signal PWRUP. The third precharge signal generator 360 may disable the third precharge signal PLEAK when the boot-up end signal MRSD is enabled.

FIG. 4 shows a diagram illustrating a representation of an example of a configuration of the pulse generator 310 illustrated in FIG. 3. Referring FIG. 4, the pulse generator 310 may include an enable driver 410, an inversion latch 420, and an inverter 430. The enable driver 410 may include a first transistor 411 and a second transistor 412. For example, the first transistor 411 may be a P-channel MOS transistor and the second transistor 412 may be an N-channel MOS transistor. The first transistor 411 may receive the power-up signal PWRUP at its gate and may receive the high voltage VH at its source. The second transistor 412 may receive the counting end signal CNTED at its gate, may be coupled to a drain of the first transistor 411 at its drain, and may be coupled to the low voltage VL at its source. The inversion latch 420 may be coupled to the drains of the first transistor 411 and the second transistor 412. The inversion latch 420 may invert the signal output from the drains of the first transistor 411 and the second transistor 412 and may keep the level of the inverted signal. The inverter 430 may generate the first control signal PWRBOS by inverting the signal output from the inversion latch 420. When the power-up signal PWRUP is enabled to a low level, the first transistor 411 of the enable driver 410 may apply the high voltage VH to a node coupled to its drain, and the inversion latch 420 and the inverter 430 may enable the first control signal PWRBOS to a high level. When the counting end signal CNTED is enabled to a high level, the second transistor 412 of the enable driver 410 may drive a node coupled to its drain to the low voltage VL, and the inversion latch 420 and the inverter 430 may disable the first control signal PWRBOS to a low level.

FIG. 5 shows a diagram illustrating a configuration of the enable control signal generator 330 illustrated in FIG. 3. Referring to FIG. 5, the enable control signal generator 330 may include a flip-flop 510, a first inverter 520, a NAND gate 530, and a second inverter 540. The flip-flop 510 may receive the first control signal PWRBOS, the high voltage VH, and the first timing control signal CNT<4>. The flip-flop 510 may provide the high voltage VH to an output node when the first control signal PWRBOS is enabled, and may block the high voltage VH provided to the output node when the first timing control signal CNT<4> is enabled. The first inverter 520 may invert the output of the flip-flop 510 and may output the inverted signal. The NAND gate 530 may receive the first control signal PWRBOS and the signal output from the first inverter 520. The second inverter 540 may invert the output of the NAND gate 530 and may output the inverted signal, which is the second control signal PWRSRE. Therefore, the second control signal PWRSRE may be enabled, after the first control signal PWRBOS is enabled, until the first timing control signal CNT<4> is enabled.

FIG. 6 shows a diagram illustrating a configuration of the first precharge signal generator 340 illustrated in FIG. 3.

Referring to FIG. 6, the first precharge signal generator 340 may include a level shifter 610 and an inverter 620. The level shifter 610 may receive a second high voltage VH2, which has a higher voltage level than the high voltage VH. The level shifter 610 may receive the second control signal PWRSRE. The level shifter 610 may output a signal having a level of the second high voltage VH2 by shifting the voltage level of the second control signal PWRSRE, which initially has the voltage level of the high voltage VH, to the second high voltage VH2. The inverter 620 may generate the first precharge signal BLPCG by inverting the output of the level shifter 610. The first precharge signal generator 340 may shift the high voltage level of the first precharge signal BLPCG to the second high voltage VH2, thereby allowing the first precharge unit 220 of the first sense amplifier 133 to perform the first precharge operation promptly and precisely.

FIG. 7 shows a diagram illustrating a configuration of the second precharge signal generator 350 illustrated in FIG. 3. Referring to FIG. 7, the second precharge signal generator 350 may include a flip-flop 710 and an inverter 720. The flip-flop 710 may receive the second control signal PWRSRE, the power-up signal PWRUP, and the second timing control signal CNT<3>. The flip-flop 710 may receive the second control signal PWRSRE at its input node, may receive the power-up signal PWRUP at its reset node and may receive the second timing control signal CNT<3> at its clock node.

The inverter 720 may be coupled to an output node of the flip-flop 710 and may generate the second precharge signal SPCG by inverting a signal output from the output node of the flip-flop 710. The flip-flop 710 may output a signal having a low level through the output node when the power-up signal PWRUP is enabled, and the inverter 720 may enable the second precharge signal SPCG. The flip-flop 710 may output the second control signal PWRSRE through the output node when the second timing control signal CNT<3> is enabled, and the inverter 720 may disable the second precharge signal SPCG.

FIG. 8 shows a diagram illustrating a configuration of the third precharge signal generator 360 illustrated in FIG. 3. Referring to FIG. 8, the third precharge signal generator 360 may include an SR latch 810 and a level shifter 820. The SR latch 810 may receive the power-up signal PWRUP at its set node and may receive the boot-up end signal MRSD at its reset node. The SR latch 810 may output an output signal having a high level when the power-up signal PWRUP is enabled and may output the output signal having a low level when the boot-up end signal MRSD is enabled. The level shifter 820 may receive the second high voltage VH2 as a power voltage. The level shifter 820 may generate, when enabled, the third precharge signal PLEAK having the second high voltage VH2 by shifting the voltage level of the output signal of the SR latch 810, which is the level of the high voltage VH, to the second high voltage VH2. The third precharge signal generator 360 may shift the high level of the third precharge signal PLEAK to the second high voltage VH2 thereby allowing the third precharge unit 260 of the first sense amplifier 133 to perform the third precharge operation promptly and precisely.

FIG. 9 shows a timing diagram illustrating an operation of the nonvolatile memory apparatus 1, in accordance with an embodiment of the present disclosure. When the power-up signal PWRUP is enabled as the nonvolatile memory apparatus 1 is powered on, the nonvolatile memory apparatus 1 may perform a boot-up operation. Because the rupture enable signal RUPEN is disabled, the sensing control signal generation circuit 132 may disable the bit line control signal SBLC. Therefore, the first memory cell array 111 may be electrically isolated from the second memory cell array 112. When the bit line control signal SBLC is disabled, the read switch 250 may be turned on and may couple the bit line BLn to the sensing node SN.

The boot-up control circuit 131 may enable the power-up signal PWRUP by detecting the level of the first power voltage VDD1. When the power-up signal PWRUP is enabled, the third precharge signal generator 360 may enable the third precharge signal PLEAK. The third precharge signal generator 360 may drive the sensing node SN to the low voltage VL by performing the third precharge operation based on the third precharge signal PLEAK. Because the second control signal PWRSRE is disabled, the first precharge signal generator 340 may generate the first precharge signal BLPCG, which is enabled. The first precharge unit 220 may drive the sensing node SN to the low voltage VL by performing the first precharge operation based on the first precharge signal BLPCG.

The pulse generator 310 may enable the first control signal PWRBOS based on the power-up signal PWRUP. When the first control signal PWRBOS is enabled, the boot-up oscillator 321 may generate the oscillating signal OSC and the boot-up counter 322 may generate the first timing control signal CNT<4> and the second timing control signal CNT<3> by counting the oscillating signal OSC.

The enable control signal generator 330 may enable, when the first control signal PWRBOS is enabled, the second control signal PWRSRE until the first timing control signal CNT<4> is enabled. That is, the second control signal PWRSRE may be disabled when the first timing control signal CNT<4> is enabled. The first precharge signal generator 340 may receive the second control signal PWRSRE and may generate the first precharge signal BLPCG. The first precharge signal generator 340 may disable the first precharge signal BLPCG while the second control signal PWRSRE is enabled. The first precharge unit 220 might not drive the sensing node SN to the low voltage VL based on the first precharge signal BLPCG, which is disabled. The first decoder 121 may further receive the second control signal PWRSRE and may enable all of the first to eighth program signals SPG<0:7> and the plurality of word lines SWL<0:7> based on the second control signal PWRSRE. Therefore, a current may flow through the bit line BLn according to resistance values of the first to eighth memory cells S0 to S7 of the first memory cell array 111, and the voltage level of the sensing node SN may change based on the current flowing through the bit line BLn. For example, when the resistance values of the first to eighth memory cells S0 to S7 are set and/or programmed for the first to eighth memory cells S0 to S7 to have low resistance values, the voltage level of the sensing node SN may increase. The sensing unit 210 may provide the high voltage VH based on the voltage level of the sensing node SN.

The second precharge signal generator 350 may keep the second precharge signal SPCG enabled on the basis of the power-up signal PWRUP and the second control signal PWRSRE. Therefore, the second precharge unit 230 may drive the output node ON to the low voltage VL without coupling the sensing unit 210 to the output node ON. The second precharge signal generator 350 may disable the second precharge signal SPCG when the second timing control signal CNT<3> is enabled. When the second precharge signal SPCG is disabled, the second precharge unit 230 may couple the sensing unit 210 to the output node ON and may change, when the high voltage VH is provided from the sensing unit 210, the voltage level of the output node ON. When the sensing unit 210 provides the high voltage VH, the voltage level of the output node ON may increase and the output latch unit 240 may generate the output signal SOUT having a high level, Therefore, the sensing period may be from when the second precharge signal SPCG is disabled to when the second control signal PWRSRE is disabled. The first sense amplifier 133 may sense data stored in the first to eighth memory cells S0 to S7 of the first memory cell array 111 through the bit line BLn during the sensing period. Since the sensing period is specified by the first timing control signal CNT<4> and the second timing control signal CNT<3> after the power-up signal PWRUP is enabled, the first sense amplifier 133 may stably sense data stored in the first to eighth memory cells S0 to S7 of the first memory cell array 111. When the output signal SOUT is generated, a voltage level may be set for programming the memory cells Am of the second memory cell array 112 or for reading data stored in the memory cells Am of the second memory cell array 112, based on the output signal SOUT, When the counting end signal CNTED is generated by the boot-up counter 322, the first control signal PWRBOS may be disabled and the boot-up signal BOOTEN may be enabled, When the boot-up signal BOOTEN is enabled, the second sense amplifier 134 may read data stored in the memory cells Am of the second memory cell array 112 based on the voltage level, which is set on the basis of the output signal SOUT. After that, when the boot-up end signal MRS© is enabled, the boot-up operation of the nonvolatile memory apparatus 1 may end. After the end of the boot-up operation, the rupture enable signal RUPEN may be enabled and the bit line control signal SBLC may be enabled on the basis of the rupture enable signal RUPEN. When required, a rupture operation and/or a program operation may be performed to the memory cells Am of the second to memory cell array 112.

The embodiments presented above serve as a limited number of examples among a larger number of possible examples. Accordingly, the nonvolatile memory apparatus, data sensing circuit, and method should not be limited based on the described is embodiments. Rather, the nonvolatile memory apparatus, data sensing circuit, and method described herein should only be limited in light of the claims that follow when taken in conjunction with the above description and accompanying drawings.

What is claimed is:

1. A nonvolatile memory apparatus comprising:
    a first memory cell array including a plurality of first memory cells coupled between a plurality of first word lines and a bit line;
    a second memory cell array including a plurality of second memory cells coupled between a plurality of second word lines and the bit line;
    a bit line switch coupled to the bit line and configured to electrically couple the first memory cell array to the second memory cell array based on a bit line control signal; and
    a data sensing circuit configured to precharge a sensing node coupled to the bit line based on a power-up signal during a period other than a first period, configured to precharge an output node during a second period within the first period, and configured to generate an output signal by changing a voltage level of the output node according to a voltage level of the sensing node after the second period.

2. The nonvolatile memory apparatus of claim 1, wherein the first memory cell array is configured to store voltage setting information for at least one of programming the second memory cells of the second memory cell array and reading data stored in the second memory cells of the second memory cell array.

3. The nonvolatile memory apparatus of claim 1, wherein, based on the bit line control signal, a bit line switch is configured to couple the first memory cell array to the second memory cell array through the bit line during a rupture period for programming the second memory cells of the second memory cell array and configured to electrically isolate the first memory cell array from the second memory cell array during a period other than the rupture period.

4. The nonvolatile memory apparatus of claim 1, wherein the data sensing circuit comprises:
    a sensing control signal generation circuit configured to generate a first precharge signal and a second precharge signal based on the power-up signal; and
    a first sense amplifier configured to generate the output signal based on the first precharge signal and the second precharge signal.

5. The nonvolatile memory apparatus of claim 4, wherein the sensing control signal generation circuit comprises:
    a pulse generator configured to generate a first control signal based on the power-up signal:
    a timing control signal generator configured to generate a first timing control signal and a second timing control signal based on the first control signal;
    an enable control signal generator configured to generate a second control signal based on the first control signal and the first timing control signal;
    a first precharge signal generator configured to generate the first precharge signal based on the second control signal; and
    a second precharge signal generator configured to generate the second precharge signal based on the second control signal and the second timing control signal.

6. The nonvolatile memory apparatus of claim 5, wherein the timing control signal generator comprises:
    a boot-up oscillator configured to generate an oscillating signal based on the first control signal; and
    a boot-up counter configured to generate the first timing control signal and the second timing control signal by counting the oscillating signal.

7. The nonvolatile memory apparatus of claim 5, wherein the sensing control signal generation circuit further comprises a third precharge signal generator configured to generate a third precharge signal based on the power-up signal and a boot-up end signal.

8. The nonvolatile memory apparatus of claim 5, wherein the timing control signal generator is further configured to generate a counting end signal, and wherein the sensing control signal generation circuit is further configured to generate a boot-up signal based on the counting end signal.

9. The nonvolatile memory apparatus of claim 5, wherein the sensing control signal generation circuit is further configured to generate the bit line control signal based on a rupture enable signal.

10. The nonvolatile memory apparatus of claim 4, wherein the first sense amplifier comprises:
    a read switch configured to couple the bit line and the sensing node based on the bit line control signal;
    a first precharge unit configured to drive a voltage level of the sensing node to a low voltage based on the first precharge signal;
    a sensing unit configured to provide a high voltage based on the voltage level of the sensing node, wherein the high voltage is higher than the low voltage;

a second precharge unit configured to, based on the second precharge signal, drive a voltage level of an output node to the low voltage and couple the sensing unit to the output node; and an output latch unit configured to generate the output signal by latching the voltage level of the output node.

11. The nonvolatile memory apparatus of claim 10, wherein the first sense amplifier further comprises a third precharge unit configured to precharge the sensing node to the low voltage based on a third precharge signal.

12. The nonvolatile memory apparatus of claim 4, further comprising a second sense amplifier configured to be coupled to the bit line during a boot-up operation period after the first period and configured to read data stored in the plurality of second memory cells of the second memory cell array.

13. An operating method of a nonvolatile memory apparatus comprising a first memory cell array and a second memory cell array electrically coupled to each other through a bit line, the operating method comprising:

electrically isolating the first memory cell array from the second memory cell array based on a power-up signal;

changing a voltage level of a sensing node through the bit line coupled to the first memory cell array;

preventing the sensing node from being precharged during a first period;

precharging an output node during a second period within the first period; and generating an output signal by changing a voltage level of the output node based on the voltage level of the sensing node after the second period.

14. The operating method of claim 13, further comprising precharging the sensing node during a boot-up operation period, wherein the precharging of the sensing node during the boot-up operation period is performed while electrically isolating the first memory cell array from the second memory cell array.

15. The operating method of claim 14, wherein a driving force of precharging the sensing node during the boot-up operation period is smaller than a driving force of changing the voltage level of the sensing node.

16. The operating method of claim 13, further comprising:

generating an oscillating signal based on the power-up signal and determining the first period by counting the oscillating signal; and determining the second period by counting the oscillating signal.

17. The operating method of claim 13, further comprising setting a voltage level based on the output signal and reading data stored in the second memory cell array based on the set voltage level.

18. The operating method of claim 13, wherein the generating the output signal by changing the voltage level of the output node based on the voltage level of the sensing node after the second period is performed when the first memory cell array and the second memory cell array are electrically coupled to each other through the bit line.

* * * * *